United States Patent [19]

Plocek et al.

[11] Patent Number: 4,826,440
[45] Date of Patent: May 2, 1989

[54] CHIP CARRIER AND HEADER ASSEMBLY AND TERMINALS THEREFOR

[75] Inventors: Edward J. Plocek; Stephen A. Colleran, both of Lisle; James T. Roberts, Oak Park; Raymond A. Silbernagel, Naperville, all of Ill.

[73] Assignee: Molex Incorporated, Lisle, Ill.

[21] Appl. No.: 261,655

[22] Filed: Oct. 24, 1988

Related U.S. Application Data

[63] Continuation of Ser. No. 112,792, Oct. 23, 1987, abandoned.

[51] Int. Cl.⁴ .............................................. H01R 23/72
[52] U.S. Cl. ..................................... 439/70; 206/328; 439/331; 439/525
[58] Field of Search ................... 439/43, 49, 50–53, 439/69–73, 78, 525, 526, 571, 507–513, 723, 724, 787, 907, 330, 331; 206/328

[56] References Cited

U.S. PATENT DOCUMENTS

| | | | |
|---|---|---|---|
| 3,568,136 | 3/1971 | Wells | 439/912 |
| 4,026,412 | 5/1977 | Henson | 439/526 |
| 4,417,777 | 11/1983 | Bamford | 439/381 |
| 4,603,930 | 8/1986 | Ito | 439/78 |
| 4,702,706 | 10/1987 | Sadigh-Behzadi | 439/525 |

*Primary Examiner*—Neil Abrams
*Attorney, Agent, or Firm*—John W. Cornell; Louis A. Hecht

[57] ABSTRACT

An I.C. chip carrier and header assembly is provided. The assembly comprises a generally rectangular shrouded header with pins force fit therein. The pins are connectable to conductive traces on a printed circuit. A protective tape may be disposed over the header to control the locations at which conformal coatings may be applied, and thereby avoid extensive cleaning operations. The assembly further comprises a carrier with receptacles for receiving box-type double female carrier terminals. The I.C. chip is mountable in the carrier with the leads thereof being connectable to the carrier terminals by soldering. A cover is locked into engagement with the carrier to define a plugable subassembly. The subassembly is then urged into lockable but removable engagement with the header and the pins thereof.

28 Claims, 5 Drawing Sheets ns with which the leads of the I.C. chip are engaged. More particularly, these terminals shown in Canadian Pat. No. 1,216,644 include spring fingers which are disposed to achieve single sided contact with the respective leads of the I.C. chip, such that the leads of the I.C. chip are urged by the spring fingers of the terminals into the nonconductive carrier. These points of contact between the spring fingers of the terminals and the leads of the I.C. chip are visually and physically relatively inaccessible. Thus, the quality of the individual connections cannot readily be observed and checked. Furthermore, this relative inaccessibility substantially limits the options available to permanently join the I.C. chip leads to the spring fingers of the carrier terminals. In this regard, the inaccessibility of the contact location substantially limits the soldering to vapor reflow techniques. Vapor reflow soldering methods require the assembled I.C. chip and carrier to be exposed to a selected vapor at a temperature sufficiently elevated to melt solder material previously plated to the I.C. chip leads and the carrier terminals. However, the abusive vapor environment and the elevated temperatures can readily damage the I.C. chips, and time-consuming and costly steps must be taken to minimize the probability of such damage. Furthermore, relatively expensive plastics must be employed for the carrier housing to withstand the elevated temperatures. The construction of the carrier shown in Canadian Pat. No. 1,216,644 provides little protection to the I.C. chip for situations where vapor reflow soldering techniques are required.

CHIP CARRIER AND HEADER ASSEMBLY AND TERMINALS THEREFOR

This application is a continuation of application Ser. No. 112,792 filed Oct. 23, 1987, now abandoned.

FIELD OF THE INVENTION

This invention relates to a high reliability carrier for an integrated circuit chip and a header into which that carrier and chip are plugable. The assembly permits the chip to be removably placed in electrical connected with conductive traces on a printed circuit board. The invention also relates to the electrically conductive terminals which are mounted in the carrier and permit a high quality electrical connection between the leads of the chip and pins which are mounted in the header and which are electrically connected to the conductive traces on the printed circuit board.

BACKGROUND OF THE INVENTION

Integrated circuit (I.C.) chips and printed circuit boards are widely employed in electronic and electromechanical devices. The environments in which I.C. chips and printed circuit boards are used are varied and expanding rapidly. Current applications of I.C. chips and printed circuit board extend to computers and their peripheral equipment, automotive vehicles, aircraft, industrial machines, office equipment and consumer electronic devices, to name but a few.

The electrically conductive leads of the I.C. chip may be directly and permanently connected to the electrically conductive traces on the printed circuit board by, for example, soldering. However, it is often desirable to replace the I.C. chip. Furthermore, the direct and permanent connection of the leads of the I.C. chip to the printed circuit board is not well suited to automation and results in a substantially unprotected electrical and mechanism connection that can readily be damaged.

In view of the problems associated with direct mechanical and electrical connections between I.C. chips and printed circuit boards, various socket assemblies have been developed. The prior art socket may include terminals which are soldered to plated through holes and/or conductive traces on the printed circuit board. The leads of the I.C. chip then can be removably placed in electrical contact with the terminals of the socket.

Many of the prior art socket devices further employ a carrier into which the I.C. chip is received. The carrier and the socket are constructed to be engageable with one another. Thus, the leads of the I.C. chip are guided into contact with the terminals of the prior art socket as the carrier and the socket are engaged with one another. One desirable socket assembly of this general type is shown in U.S. Pat. No. 4,417,777 which issued to William C. Bamford on Nov. 29, 1983 and is assigned to the assignee of the subject invention. Other devices which employ the combination of an I.C. chip carrier and a socket are shown in U.S. Pat. No. 4,354,718 which issued to Bright et al on Oct. 19, 1982; U.S. Pat. No. 4,637,670 which issued to Coller et al on Jan. 20, 1987; U.S. Pat. No. 4,547,031 which issued to Korsunsky on Oct. 15, 1985; U.S. Pat. No. 4,470,650 which issued to Lundergan on Sept. 11, 1984 and Canadian Pat. No. 1,216,644 which issued to Sadigh-behzadi on Jan. 13, 1987.

The assembly shown in Canadian Pat. No. 1,216,644 differs from the connectors shown in the other prior art references cited above in that the carrier includes termi The device shown in Canadian Pat. No. 1,216,644 further includes a socket having electrically conductive pins which are joined to the conductive traces on the printed circuit board. The socket is dimensioned to receive the carrier such that portions of the carrier terminals engage the corresponding pins in the socket. The socket is dimensionally narrow compared to the carrier. As a result, any torque created as the carrier is inserted can readily tilt the narrow socket, thereby damaging the electrical connections between the socket pins and the printed circuit board. Similarly, the removal of the carrier from the socket is likely to cause a torque that will damage the connection between the narrow socket and the printed circuit board. To reduce the probability of such damage during removal of the carrier, the socket of Canadian Pat. No. 1,216,644 is provided with a pair of separate pivotally mounted latches with lever portions intended to urge the carrier out of the socket. However, the presence of the large latches makes the protection of the pins difficult during the application of conformal coatings. Consequently, the commercial embodiments of the socket shown in Canadian Pat. No. 1,216,644 require a separate molded plastic housing to be placed over the socket and latches while conformal coatings are applied to the connections of the socket to the printed circuit board. This costly housing serves no other function and is later discarded.

In view of the above, it is an object of the subject invention to provide a more efficient, reliable and effective carrier and socket or header assembly for mounting I.C. chips to a printed circuit board.

It is another object of the subject invention to provide an I.C. chip carrier and header assembly wherein the soldered connection between the I.C. chip leads and the corresponding carrier terminals can be inspected visually.

An additional object of the subject invention is to provide an I.C. chip carrier and header assembly wherein an extremely effective electrical connection is achieved between the chip leads and the carrier terminals and between the carrier terminals and the header pins.

A further object of the subject invention is to provide an I.C. chip carrier and header assembly wherein the header provides a sturdy mechanical base against the printed circuit board and wherein selected portions of the header pins readily and inexpensively can be protected from undesirable intrusion from conformal coatings and flux.

Another object of the subject invention is to provide a protective I.C. chip carrier and header assembly wherein the carrier protective cover performs of redundant locking function by locking itself to the carrier and by releasably locking the carrier to the header.

Still another object of the subject invention is to provide an I.C. chip carrier and header assembly which facilitates and enables the removal of the carrier and chip with one hand and without creating torques within the assembly.

It is a further object of the subject invention to provide an I.C. chip carrier and header assembly which enables either vapor phase reflow soldering or non-vapor reflow soldering of the I.C. chip leads to the carrier terminals.

Still an additional object of the subject invention is to provide carrier terminals that can achieve improved electrical connection to both the I.C. chip leads and to the header pins.

SUMMARY OF THE INVENTION

The subject invention is directed to an I.C. chip carrier and header assembly comprising: a chip carrier; an array of carrier terminals mounted in the carrier; a cover lockingly engageable with the carrier to cover and protect chip mounted therein; and a header for mounting on a printed circuit board and constructed to receive and engage the carrier.

The header of the subject assembly may be of generally box shaped configuration with a bottom wall and upstanding side walls connected to and extending from the bottom wall to define a socket for receiving a portion of the carrier. The bottom wall may comprise a plurality of apertures through which pins extend. The dimensions of the pins and the apertures may be selected to achieve a secure mechanical force fit therebetween. Each pin may be disposed to extend from both sides of the bottom wall of the header. The magnitude of the extension of the pins from the bottom side of the bottom wall may be selected to facilitate the electrical connection of the pins to conductive traces on the printed circuit board. The bottom wall of the header may further be provided with downwardly extending standoffs to permit visual inspection of the connections of the pins to the printed circuit board, to facilitate soldering and subsequent board washing, and to enhance the application of conformal coatings. The pins preferably extend from the top surface of the bottom wall of the header a distance less than the height of the side walls of the header. Thus, an inexpensive disposable plastic film or tape may be disposed over the side walls of the header to protect the pins and prevent unintended intrusion of flux and conformal coatings applied during the assembly process. The header may further comprise means for locking the carrier thereto.

The carrier also may be of generally box shaped configuration with a bottom wall and upstanding side walls. The bottom wall of the carrier may include an array of receptacles therein dimensioned to receive carrier terminals. The receptacles may extend into the top face of the bottom wall and entirely through to the bottom face of the bottom wall. Additionally, each aperture may extend to a side face of the carrier thereby permitting visual inspection and physical access to the carrier terminals from three sides of each terminal. This access increases the options available for soldering the I.C. chip leads to the terminals and makes computer scanning an option for quality control. The carrier and the header may include polarization means to ensure proper orientation therebetween.

Each receptacle of the carrier lockingly receives a carrier terminal designed to securely receive both the pins of the header and the leads of the I.C. chip. More particularly, each carrier terminal may be of a generally double female box configuration, with a first three-sided box to substantially surround and redundantly engage the corresponding I.C. chip lead and a second four-sided box to substantially surround and redundantly engage the corresponding header pin. The pin-engaging second female portion of the carrier terminal includes a pair of opposed inwardly directed contact beams to engage opposite sides of the associated header pin preferably at different axial locations along the pin. The first female portion of the carrier terminal includes a contact beam dimensioned to urge the I.C. chip lead into the opposed wall of the carrier terminal to again achieve a double sided redundant contact. Portions of the carrier terminal may include apertures therethrough to enable direct contact with a heater or solder tip to enable non-vapor reflow soldering of the I.C. chip lead to the carrier terminal. This option avoids the need to expose the I.C. chip and carrier to the harsh environment inherent to vapor reflow soldering methods and enables less expensive plastic to be used in molding the carrier. The above described accessibility to the carrier terminal provided by the unique carrier construction further facilitates this non-vapor reflow soldering method. However, the terminals and the chip leads can be connected by vapor phase reflow soldering provided that an appropriate heat resistant plastic is employed for the carrier. Furthermore, in certain non-vibration environments, the forces exerted between the contact beam and the opposed wall of the terminal will provide a high quality electrical connection with the chip lead, and soldering can be avoided.

The assembly further comprises a cover dimensioned to at least partly enclose the portion of the carrier in which the I.C. chip is placed and to be lockingly engaged with the carrier. The cover further includes locking latches on opposed ends thereof to engage with corresponding locking structures on the header. Thus, the cover is lockingly engageable with the carrier to define a plugable carrier subassembly. The cover then enables the locking engagement of the carrier subassembly to the header. The locking latches which attach the cover/carrier subassembly to the header are disposed at opposite ends of the carrier and may be constructed to achieve single-handed disengagement of the carrier subassembly from the header. Thus, the cover/carrier subassembly with the chip securely engaged therein can readily be disengaged from the header with a single hand and without creating potentially damaging torques on the electrical connections within the assembly. Additionally, the cover protects the I.C. chip against certain types of electrostatic discharge that could create shorts and damage or destory the chip.

DETAILED DESCRIPTION OF THE PREFERRED EMBODIMENTS

Figure 1:
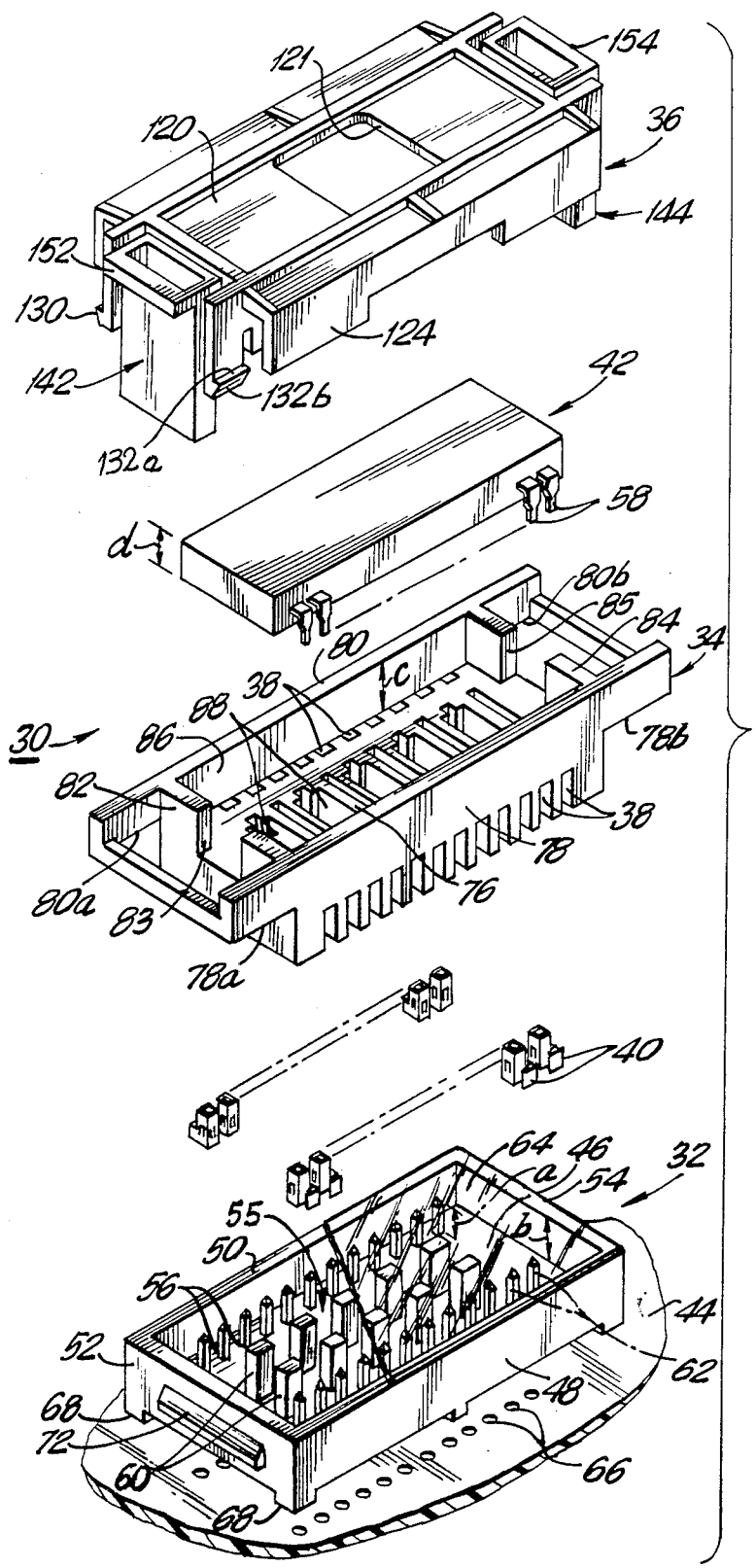
FIG. 1 is an an exploded perspective view of the connector assembly in use with an I.C. chip and a printed circuit board.
Figure 2:
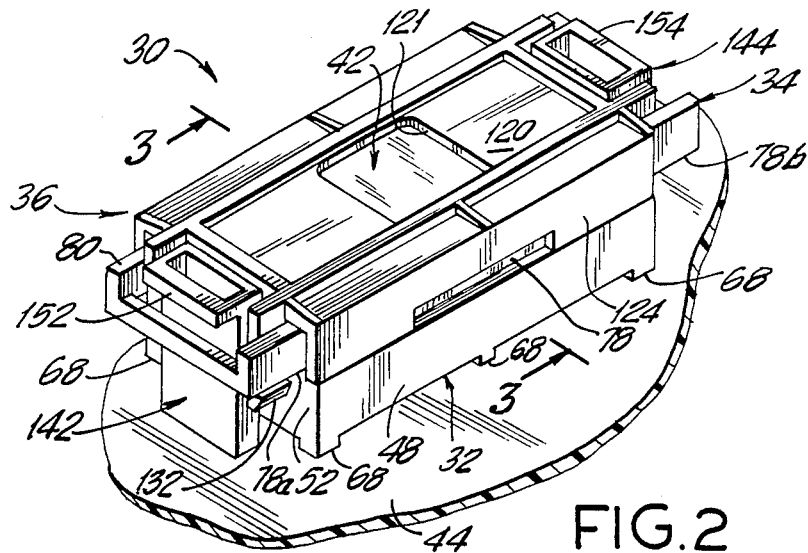
FIG. 2 is a perspective view of the I.C. chip carrier assembly mounted on a printed circuit board.
Figure 3:
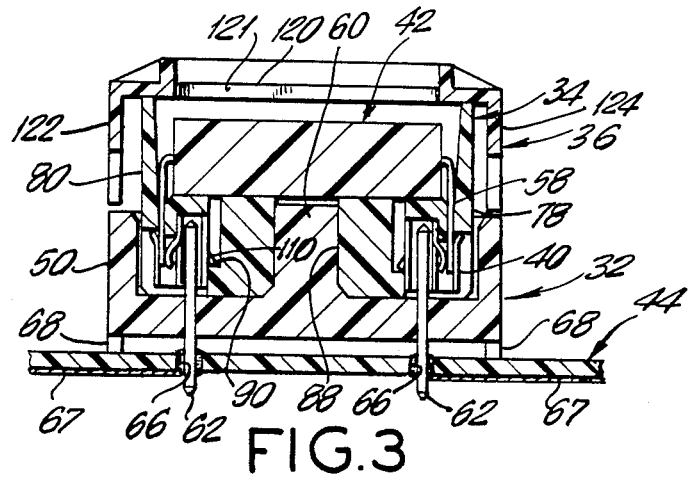
FIG. 3 is a cross-sectional view taken along line 3—3 of FIG. 2.
Figure 6:
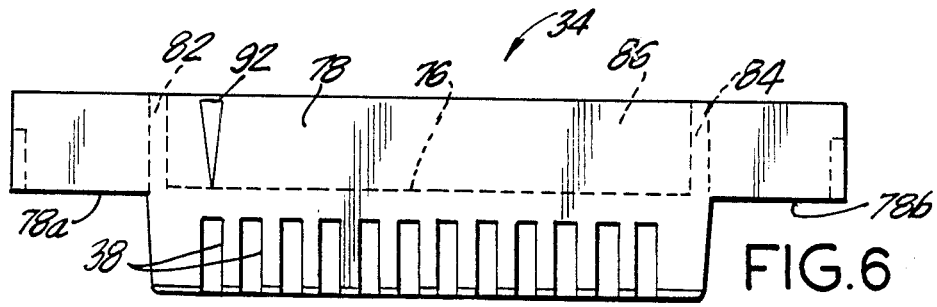
FIG. 6 is a front elevational view of the carrier of the subject invention.
Figure 4:
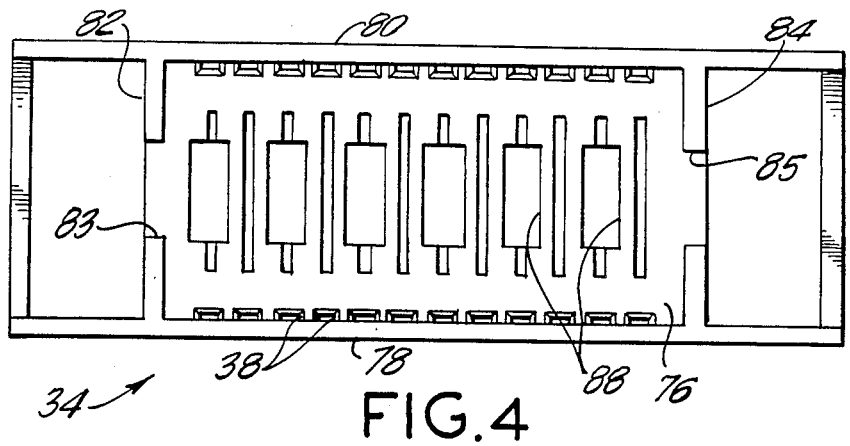
FIG. 4 is a top plan view of the carrier of the subject invention.
Figure 5:
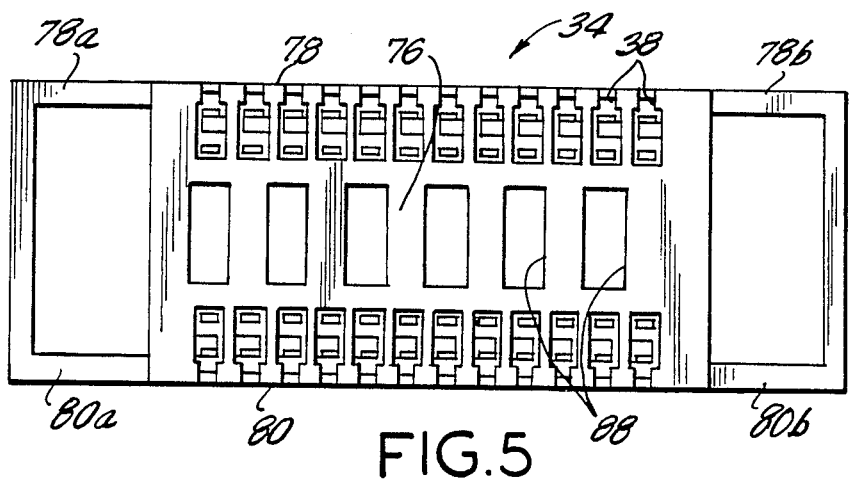
FIG. 5 is a bottom plan view of the carrier of the subject invention.
Figure 7:
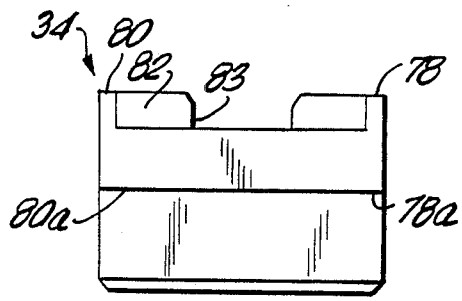
FIG. 7 is an end elevational view of the carrier of the subject invention.

The chip carrier assembly of the subject invention is shown in FIGS. 1–3 and is identified generally by the numeral 30. As shown most clearly in FIGS. 1 and 3, the chip carrier asembly 30 comprises a header 32, a carrier 34 and a cover 36. The carrier 34 includes a plurality of receptacles 38 each of which is dimensioned to lockingly receive a box-type double female carrier terminal 40. The carrier 34 is further constructed to receive an I.C. chip 42 as explained in greater detail below. The entire assembly 30, and specifically the header 32 are intended for mounting on a printed circuit board indicated generally by the numeral 44.

The header 32 is of generally rectangular boxshaped configuration and is molded from an integral unitary piece of plastic material. The particular type of plastic is selected to achieve heat deflection and chemical resistance appropriate for the soldering processes used to connect the pins of the header 32 to the printed circuit board 44. For example, a glass-filled P.E.T. may be selected if wave flow soldering is to be employed. However, if the header 32 is to be subjected to a vapor phase reflow soldering environment, it may be necessary to employ a plastic with higher temperature resistance, such as a liquid crystal polymer.

The header 32 is molded to comprise a generally planar bottom wall 46, upstanding generally parallel side walls 48 and 50 and upstanding generally parallel end walls 52 and 54. More particularly, the side walls 48 and 50 and the end walls 52 and 54 are connected to and extend from the bottom wall 46 and are further connected to one another to define a socket area 55 for receiving the carrier 34, as explained in greater detail below.

The bottom wall 46 of the header 32 is further characterized by a plurality of apertures 56 extending entirely therethrough and disposed to define an array which corresponds to the orientation of the leads 58 extending from the I.C. chip 42. In the embodiment depicted in the figures thereto, the apertures 56 extending through the bottom wall 46 of header 32 are disposed to define two parallel rows of apertures corresponding to the two parallel rows of leads 58 extending from the I.C. chip 42. Other arrays may be employed with chips of different configurations. The header 32 is further characterized by polarization keys 60 which extend from the bottom wall 46 and ensure proper orientation and selection of the carrier 34 relative to the header 32.

A plurality of electrically conductive pins 62 extend through the apertures 56 in the bottom wall 46 of header 32. More particularly, the pins have a cross section which is dimensionally greater than the initial dimensions of the apertures 56. Thus, the pins 62 are in an interference fit around the entire periphery of the apertures 56 to ensure that the bottom wall 46 of header 32 is sealed to eliminate flux and conformal coating intrusion into the socket area 55 of the header 32. The pins 62 extend upwardly from the bottom wall 46 a distance "a" which is less than the height "b" of the side walls 48, 50 and end walls 52 and 54. As a result, a protective tape or file 64 is initially extended across and connected to the side walls 48, 50 and end walls 52 and 54 to protect the socket area 55 defined thereby, including the pins 62 from conformal coating, and the like, thereby avoiding the time-consuming and costly steps associated with cleaning the areas of the pins 62 to be contacted by the carrier terminals 40. The protective tape or film 64 is extremely inexpensive, is easy to apply and is easy to remove. As a result, this embodiment is substantially less expensive than prior art carrier assemblies requiring a separate molded plastic disposable housing to protect the pins. Typically, the pins 62 are inserted and the tape 64 applied at the place of manufacture of header 32, so that the consumer receives an assembled and protected header. However, the tape may be applied at other times, such as after the pins 62 are soldered to the board 44, and after the board 44 is washed, but prior to the application of the conformal coating.

As noted above, the header 32 is mounted to a printed circuit board 44. More particularly, the printed circuit board 44 is provided with arrays of plated through holes 66 extending therethrough. The plating disposed at the through holes 66 communicates with conductive traces 67 on the printed circuit board 44. The pins 62 extend from the bottom side of the bottom wall 46 of header 32 a sufficient distance to enter the plated through holes 66. The pins then are mechanically and electrically connected to the plated through holes 66 by, for example, wave soldering or by vapor reflow soldering techniques. In other embodiments, the holes 66 are not plated, and the pins 62 are soldered directly to the conductive traces 67. To facilitate this soldering and enable visual inspection of the connections, the header 32 is provided with an array of standoffs 68 which function to space the bottom wall 46 of header 32 slightly from the printed circuit board 44. After this soldering has been completed, a conformal coating will be applied by dipping or other means to protect the electrical connection between the pins 62 and the plated through hole 66. The standoffs facilitate the application of this conformal coating, while the tape 64 protects the portion of pins 62 above the bottom wall 46 from both the conformal coating and flux.

The header 32 further includes a pair of latch wings 72 and 74 unitary with the end walls 52 and 54 respectively. The latch wings 72 and 74 will enable the subassembly comprising the carrier 34, the cover 36 and the I.C. chip 42 to be lockingly but removably engaged to the header 32, as explained further below.

The carrier 34 also is of generally rectangular configuration and is molded from a unitary piece of plastic material. As noted above, and as explained in greater detail below, the carrier 34 and the terminals 40 of the subject invention are particularly constructed to enable non-vapor reflow solder connection of the leads 58 of I.C. chip 42 to the carrier terminals 40. In these situations, the entire carrier 34 is not subjected to the high heat environment associated with vapor reflow soldering techniques. As a result, a plastic material, such as glass-filled P.E.T., can be used for the carrier 34. If the carrier is to be subject to the vapor reflow soldering environment, the carrier 34 would have to be formed from a heat resistant and substantially more expensive plastic material such as liquid crystal polymer. If the chip leads are not to be soldered to the terminals, such as in certain computer applications, the carrier 34 and cover 36 may be formed from an inexpensive material such as nylon.

The carrier 34 is of generally rectangular configuration and includes a bottom wall 76, a pair of parallel upstanding side walls 78 and 80 and a pair of parallel upstanding end walls 82 and 84. The side walls 78, 80 and end walls 82, 84 define a protective chip receiving recess 86 which is dimensioned to receive the I.C. chip 42. More particularly, the side walls 78 and 80 and end walls 82 and 84 have a height "c" which exceeds the height "d" of chip 42 as shown in FIG. 1. Thus, the chip 42 is never contacted by the cover 36. The end walls 82 and 84 further include access slots 83 and 85 to facilitate removal of chip 42 if necessary.

The bottom wall 76 of the carrier 34 is characterized by a plurality of polarization apertures 88 which are disposed and dimensioned to engage the polarization keys 60 on header 32. Additionally, as noted above, the carrier 34 includes arrays of terminal receptacles 38. The terminal receptacles 38 are formed to receive the leads 58 of the I.C. chip 42, and are formed with a tapered lead-in to facilitate robotic assembly with the chip 42. Additionally, the receptacles 38 extend entirely through the bottom wall 76 of the carrier 34 to provide visual and physical access to the carrier terminals both from the top of the bottom wall 76, from the bottom of the bottom wall 76 and from the respective sides of the carrier 34. This construction achieves several important objectives. First, non-vapor soldering means can be employed to join the I.C. chip leads 58 to the carrier terminals 40. Second, the soldered connection is visually observable from three sides to enable the use of computer scanning devices for quality control. Third, the side access to ach receptacle 38 achieves probeability for electrically testing the chip lead connections.

As shown most clearly in FIG. 3, each receptacle 38 includes an internal locking ledge 90 which securely and positively engages a portion of the carrier terminals 40, as explained further below. Additionally, as shown in both FIGS. 1 and 3, the bottom and side access areas of each aperture 38 are larger than the corresponding access at the top side of bottom wall 76. This construction ensures a carefully controlled and guided alignment of the I.C. chip leads 58 into the carrier terminals 40 as explained further below. The configuration of each receptacle 38 positively controls the position and alignment of the carrier terminals 40.

The carrier side walls 78 and 80 extend beyond the respective end walls 82 and 84 to define locking surfaces 78a, 78b, 80a and 80b. As explained further below, the locking surfaces 78a, b and 80a, b enable the locking engagement between the carrier 34 and cover 36 to define a carrier subassembly as explained below. The side wall 78 of the carrier 34 is further provided with an indicator 92 to clearly identify pin number one. The indicator 92 will clearly identify the proper orientation of the carrier 34 relative to the header 32 and the printed circuit board 44 thereby avoiding trial and error insertion and complete reliance of the polarization keys 60 and polarization apertures 88.

Figure 8:
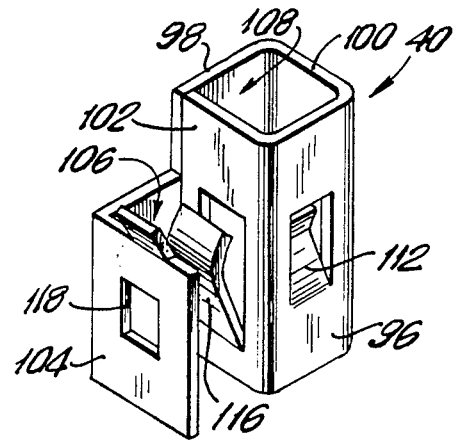
FIG. 8 is a perspective view of the terminal of the subject invention.
Figure 13:
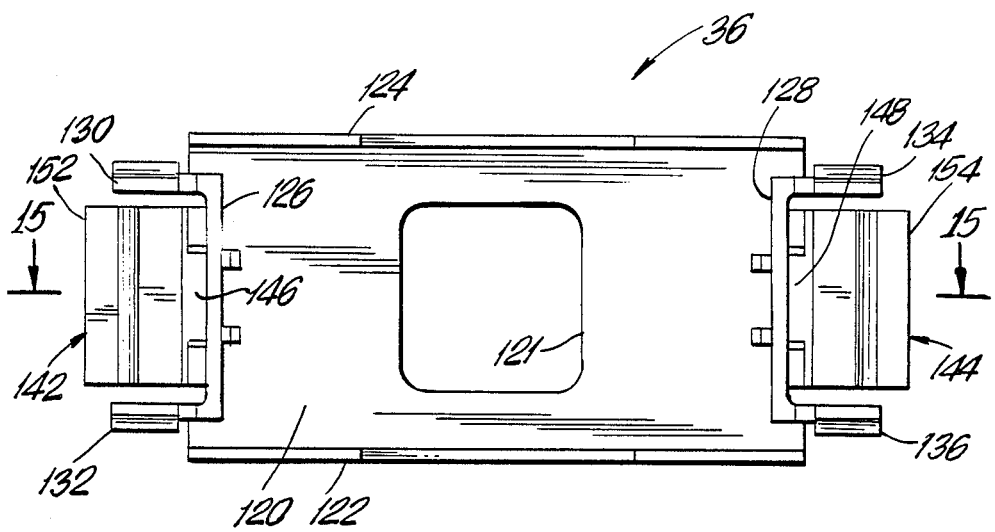
FIG. 13 is a bottom plan view of the cover shown in FIGS. 11 and 12.
Figure 15:
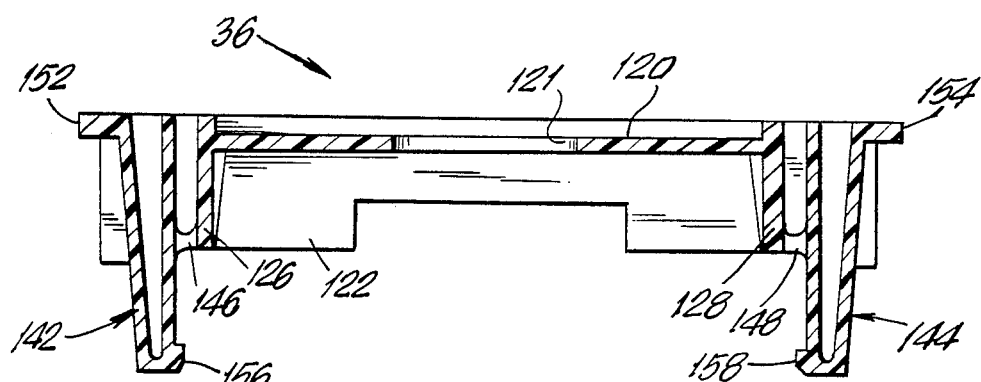
FIG. 15 is a cross-sectional view of the cover taken along lines 15—15 in FIG. 13.
Figure 9:
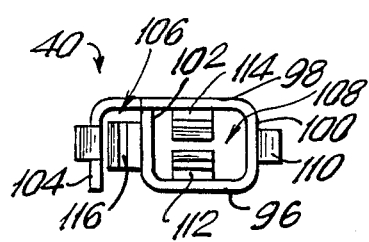
FIG. 9 is a top plan view of the terminal shown in FIG. 8.
Figure 10:
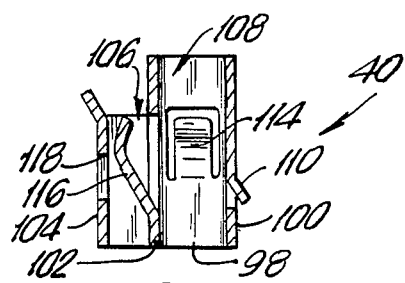
FIG. 10 is a cross-sectional view along line 10—10 in FIG. 9.
Figure 11:
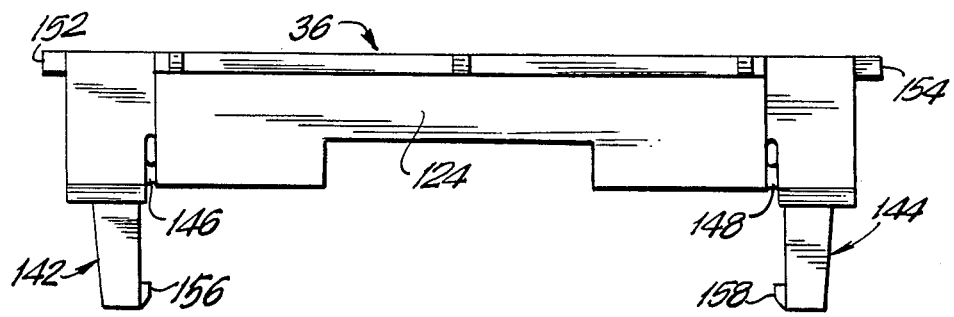
FIG. 11 is a front elevational view of the cover of the subject invention.
Figure 12:
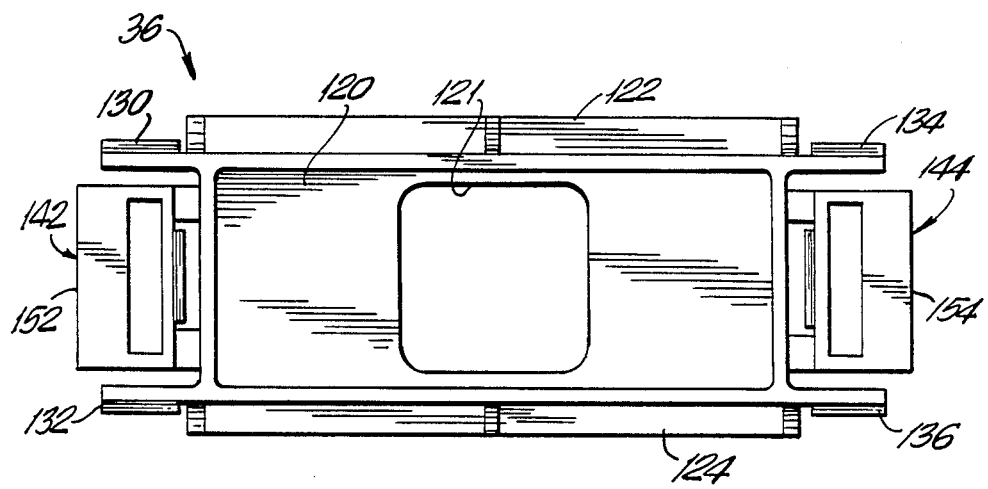
FIG. 12 is a top plan view of the cover shown in FIG. 11.
Figure 14:
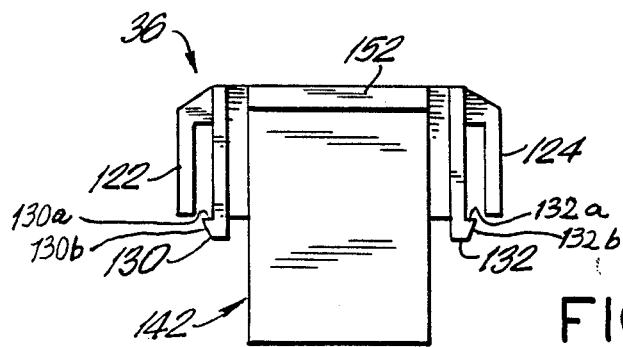
FIG. 14 is an end elevational view of the cover.

The carrier terminals 40 are depicted relative to the other components of the assembly 30 in FIGS. 1 and 3, and are depicted alone in FIGS. 8-10. Each carrier terminal 40 comprises opposed parallel end walls 96 and 98, an inner wall 100 extending orthogonally between and connecting the end walls 96 and 98, an intermediate wall 102 parallel to inner wall 100 and extending from the end wall 96, and an outer wall 104 extending from the end wall 98 and parallel to the inner wall 100. The resulting terminal structure effectively defines a box-type first female socket portion 106 to receive a lead 58 and a generally box-type second female socket portion 108 to receive a pin 62.

The carrier terminal 40 is further stamped to define a locking lance 110 extending from the inner wall 100 and disposed to lockingly engage the ledge 90 in the corresponding receptacle 38 of the carrier 34. The second socket portion 108 is further characterized by a pair of inwardly extending cantilevered contact beams 112 and 114. The contact beam 112 is longer than the contact beam 114 to ensure that the respective contact beams 112 and 114 mate with the associated pins 62 at different axial locations therealong. These different lengths of the contact beams 112 and 114 prevent intermittancy that could otherwise result from vibrations in the environment in which the carrier assembly 30 is employed.

The intermediate wall 102 is characterized by a cantilevered contact beam 116 which extends toward the outer wall 104. More particularly, the cantilevered contact beam 116 extend convexly into the first socket portion 106 to achieve a broad contact area with the associated I.C. chip lead 58, and to urge the lead 58 against outer wall 104, thereby achieving a two-sided redundant contact covering a large area of lead 58. The outer wall 104 of the carrier terminal 40 lies generally opposite the cantilvered contact beam 116, and is characterized by a window 118 disposed generally in line with the contact beam 116. The window 118 facilitates the direct application of a heater tip or solder tip to the area of contact between the contact beam 116 and the corresponding I.C. chip lead 58 to enable reflow soldering therebetween. However, the window 118 can be provided on embodiments where vapor phase reflow soldering is employed, or where no soldering is required.

The terminal 40 is selectively plated to achieve the perferred performance and electrical connections. More particularly, the entire terminal 40 preferably is plated with nickel. However, the contact beam 116 preferably is plated with solder to achieve the reflow soldering explained above upon the application of heat thereto. In embodiments of the subject invention employing vapor phase reflow soldering, both the contact beam 116 and the facing surface of outermost wall 104 may be solder plated to achieved a two-sided redundant connection. the contact beams 112 and 114 of course will not be soldered to pins 62, but a high quality and repeatable electrical connection is required. To positively protect against corrosion the contact beams 112 and 114 preferably are coated with gold.

The cover 36 is constructed to perform two distinct and important functions. In particular, the cover 36 is constructed to lockingly engage with the carrier 34 to cover and protect the I.C. chip 42 and to thereby define a plugable subassembly. Second, the cover 36 is constructed to lockingly but releasably engage the subassembly with the header 32 such that convenient one-hand removal from the locked condition on the header 32 is possible. With reference to FIGS. 1-3 and 22-26, the cover 36 includes a top wall 120 dimensioned to extend substantially across the chip recess 86 of the carrier 34. However, the cover 36 is shown with an optional window 121 to enable visual inspection and identification of chip 42. Furthermore, as shown in FIG. 3, the carrier prevents direct and potentially damaging contact between the top wall 120 and chip 42.

The cover 36 further comprises a pair of opposed parallel side walls 122 and 124 and a pair of opposed parallel end walls 126 and 128, all of which extend orthogonally from the top wall 120. However, the side walls 122 and 124 are spaced from the end walls 126 and 128. The side walls 122 and 124 and the end walls 126 and 128 are disposed to enable the cover 36 to be telescopingly engaged over the carrier 34. More particularly, the portions of the carrier side walls 78 and 80 which extend beyond the carrier end walls 82 and 84 slide into the spaces between the cover side walls 122 and 124 and the cover end walls 126 and 128. The cover end walls 126 and 128 also cover the access slots 83 and 85 in carrier 34.

The cover 36 further includes locking latches 130 and 132 extending downwardly from the end wall 126 and locking latches 134 and 136 extending downwardly from the end wall 128. The locking latches 130-136 are generally parallel to the side walls 122 and 124 of cover 36, and include locking ledges 130a-136a which are disposed to engage the locking surfaces 78a, 78b and 80a, 80b on the carrier 34. The locking latches 130-136 are further characterized by ramps 130b-136b which effectively guide the locking latches 130-136 into engagement with the locking surfaces 78a, 78b and 80a, 80b, thereby facilitating robotic assembly of the cover 36 to the carrier 34.

The cover 36 further includes subassembly latch arms 142 and 144 which are connected to the respective end walls 126 and 128 at locations 146 and 148 respectively. The connection of the subassembly latch arms 142 and 144 to the end walls 126 and 128 is disposed at locations approximately midway along the length of each subassembly latch arm 142, 144. The uppermost portion of each subassembly latch arm 142, 144 is substantially in line with the top wall 120, and defines latch arm actuators 152 and 154. The ends of the latch arms 142 and 144 remote from the actuators 152 and 154 define locking ledges 156 and 158 which are facing one another and which are disposed to engage the latch wings 72 and 74 on the header 32. When the actuators 152 and 154 are urged toward one another by, for example, pressure exerted by a thumb and forefinger, the locking ledges 156 and 158 at the opposed ends of the respective latch arms 142 and 144 will rotate away from one another. Both the locking ledges 156 and 158 and the latch wings 72 and 74 are ramped to provide large convenient lead-ins which facilitate robotic plugable mating of the combined subassembly of the cover 36 and carrier 34 to the header 32.

In the typical installation, the pins 62 are forced into the apertures 56 in the header 32 to achieve an interference fit that prevents intrusion of flux and conformal coatings into the socket 55. The protect tape 64 is then applied to further protect the socket 55. The assembled header 32 is then sold to the user. The header 32 is then positioned on the printed circuit board 44 such that the pins 62 extend through the plated through holes 66 in the printed circuit board 44. The pins 62 are then electrically connected to the plated through holes 66 by, for example, wave flow soldering techniques. A conformal coating is then applied to the area of the electrical connections between the pins 62 and the plated through holes 66. The tape 64 covering the header 32 prevents any conformal coating material from being deposited within the header 32. However, after a complete application of the conformal coating, the tape 64 may be removed for subsequent assembly steps.

The carrier terminals 40 are mounted in the carrier 34 by urging upwardly from the bottom side of the carrier 34, until the locking lances 110 are locked in the respective ledges 90 of receptacles 38. The I.C. chip 42 is then mounted in recess 86 of the carrier 34 such that the leads 58 thereof advance into the ramped upper access to the respective receptacles 38. More particularly, the leads 58 are received in the terminals 40, and between the cantilevered contact beam 116 and the outer wall 104 thereof. This configuration ensures double sided redundant contact with the leads 58 of the I.C. chip 42. The I.C. chip leads 58 are then reflow soldered into position on the corresponding carrier terminals 40. The cover 36 is then locked into engagement with the carrier 34 to enclose and protect the I.C. chip 42 and to define a plugable subassembly which is then urged into plugged engagement with the header 32. This plugged engagement of the carrier subassembly with the header 32 ensures that the respective pins 62 are received within the terminals 40 with double sided redundant electrical connection by the cantilevered spring loaded contact beams 112 and 114. The subassembly of the carrier 34 and cover 36 is locked into engagement by the latch arms 142 and 144 which snap into engagement with the ramped latch wings 72 and 74. This subassembly may subsequently be removed from the header 32 with one hand, by merely urging actuators 152 and 154 of the latch arms 142 and 144 toward one another to ensure disengagement of the ledges 156 and 158 from the header latch wings 72 and 74.

While the invention has been described with respect to a preferred embodiment, it is apparent that various changes can be made without departing from the scope of the invention as defined by the appended claims.

I claim:

1. An I.C. chip carrier assembly for an I.C. chip having a plurality of electrically conductive leads extending therefrom, said assembly comprising:
a chip carrier comprising a bottom wall having a plurality of receptacles extending therethrough, said receptacles being disposed to be generally in register with the leads of the I.C. chip;

a plurality of carrier terminals mounted respectively in each of said carrier receptacles, each said carrier terminal comprising first and second female terminal portions, with the first female portion of each said carrier terminal being disposed to receive one said I.C. chip lead;

a cover dimensioned and configured for locking engagement to said carrier to define a carrier subassembly, said cover further comprising a pair of subassembly latch arms connected to and extending therefrom;

a header for mounting to a printed circuit board, said header comprising a bottom wall having a plurality of electrically conductive pins extending therethrough and disposed to be substantially in register with the second female portion of the respective carrier terminals, said header comprising locking means for lockingly engaging the subassembly latch arms of the cover to securely engage the carrier subassembly to the header.

2. An I.C. chip carrier assembly as in claim 1 wherein the header further comprises a plurality of interconnected upstanding walls connected to and extending from said bottom wall to define a socket for receiving at least a portion of said carrier, said upstanding walls substantially surrounding the pins of said header and extending from said bottom wall of a distance equal to or greater than the height of said pins.

3. An I.C. chip carrier assembly as in claim 2 wherein said header further comprises a protective material removably disposed in contact with said upstanding walls to substantially completely enclose the pins surrounded by said upstanding walls.

4. An I.C. chip carrier assembly as in claim 1 wherein said header further comprises a plurality of standoffs connected to and extending from said bottom wall, said standoffs defining legs for spacing said bottom wall from a printed circuit board.

5. An I.C. chip carrier assembly as in claim 1 wherein the bottom wall of said carrier comprises opposed top and bottom surfaces and a plurality of side surfaces, and wherein each receptacle thereof extends entirely through said bottom wall from the top surface thereof to the bottom surface and further extends to at least one said side surface.

6. An I.C. chip carrier assembly as in claim 1 wherein said carrier comprises a plurality of upstanding walls connected to and extending from said bottom wall thereof to define a chip recess for receiving and protecting the I.C. chip.

7. An I.C. chip carrier assembly as in claim 6 wherein the cover comprises a top wall and a plurality of side walls extending from and connected to said top wall, said side walls of said cover being disposed to be placed in generally telescoping engagement with the upstanding walls of said carrier, such that the locking engagement of the cover to the carrier substantially encloses a chip mounted in the chip recess of said carrier.

8. An I.C. chip carrier assembly as in claim 7 wherein the cover comprises a plurality of carrier latch arms connected to and extending therefrom, said carrier latch arms being disposed to lockingly engage said cover with said carrier to define a plugable subassembly.

9. An I.C. chip carrier assembly as in claim 8 wherein said subassembly latch arms each comprise a locking ledge engageable with the locking means of said header, and further comprise actuator means for rotating said locking ledges away from one another and out of engagement with said header, for disengaging said carrier subassembly from said header.

10. An I.C. chip carrier assembly as in claim 1 wherein said carrier and said header comprise polarization means for assuring proper orientation relative to one another.

11. An I.C. chip carrier assembly as in claim 1 wherein each carrier terminal comprises a pair of opposed cantilevered contact beams extending into the second female portion thereof for achieving double-sided redundant electrical contact with the pins of said header.

12. An I.C. chip carrier assembly as in claim 11 wherein the contact beams of said second female portion are of different respective lengths.

13. An I.C. chip carrier assembly as in claim 1 wherein each said carrier terminal is formed from a unitary piece of electrically conductive material and comprises an inner wall, an outer wall and an intermediate wall disposed between said inner and outer walls and generally parallel thereto, a first end wall connected to and extending orthogonaly between said inner and outer walls and a second end wall connected to and extending between said inner wall and said intermediate wall such that said first female socket portion is defined by said intermediate wall, said outer wall and a portion of said first end wall, and wherein the second female portion thereof is defined by said inner wall, said intermediate wall, said second end wall and a portion of said first end wall.

14. An I.C. chip carrier assembly as in claim 13 wherein each said carrier terminal further comprises cantilevered contact beams extending toward one another into said second female portion thereof from the first and second end walls.

15. An I.C. chip carrier assembly as in claim 14 wherein the contact beams extending into the second female portion are of different respective lenghts.

16. An I.C. chip carrier assembly as in claim 13 wherein each said carrier terminal comprises a cantilevered contact beam extending from said intermediate wall into the first female portion thereof, for urging one said I.C. chip lead into contact with the outer wall of said carrier terminal.

17. An I.C. chip carrier assembly as in claim 16 wherein the outer wall of each said carrier terminal is characterized by an aperture generally aligned with the contact beam extending into the first female portion thereof, whereby said aperture facilitates non-vapor soldering of said I.C. chip lead to said carrier terminal.

18. An I.C. chip carrier assembly as in claim 17 wherein the recess of said carrier comprises a bottom wall dimensioned for receiving the chip, said bottom wall including opposed top and bottom surfaces and a plurality of side surfaces extending therebetween, said receptacles of said carrier extending entirely through said bottom wall from said top surface to said bottom surface and to one of said side surfaces, the aperture of each said carrier terminal mounted in said receptacle being substantially in register with the portion of said receptacle extending through to the side surface of said carrier bottom wall.

19. A double female terminal for connecting an I.C. chip lead to an electrically conductive pin, said terminal being formed from a unitary piece of electrically conductive material stamp formed to define generally parallel inner and outer walls, an intermediate wall parallel to and intermediate said inner and outer walls, a first end wall connected to and extending orthogonally between said inner and outer walls and a second end wall connected to and extending between said inner wall and said intermediate wall, such that said intermediate wall, said outer wall and a portion of said first end wall define a first female socket portion of said terminal, and such that said inner wall, said intermediate wall, said second end wall and a portion of said first end wall define a second female portion of said terminal.

20. A terminal as in claim 19 further comprising cantilevered contact beams extending toward one another and into said second female portion of said terminal from the first and second end walls repsectively.

21. A terminal as in claim 20 wherein the first and second contact beams extending into said second female portion are of different respective lengths.

22. A terminal as in claim 19 comprising a cantilevered contact beam extending from said intermediate wall convexly into said first female portion of said terminal for urging an I.C. chip lead into contact with the outer wall of said terminal.

23. A terminal as in claim 22 wherein the outer wall of said terminal is characterized by an aperture generally aligned with the contact beam extending into the first female portion thereof for facilitating non-vapor soldering or an I.C. chip lead to said terminal.

24. A terminal as in claim 23 wherein opposed portions of said outer wall and said contact beam extending into said first female portion are plated with solder.

25. An I.C. chip carrier assembly for electrically connecting and I.C. chip to a printed circuit board, said I.C. chip comprising a plurality of electrically conductive leads extending therefrom, said carrier assembly comprising:
  a pluggable carrier sub-assembly including:
    a carrier having a bottom wall with opposed top and bottom surfaces and opposed side surfaces and having a pair of opposed parallel side walls extending upwardly from said bottom wall and a pair of opposed parallel end walls extending upwardly from said bottom wall, said side and end walls defining a chip-receiving recess, said carrier further having a plurality of receptacles defined therein extending through said bottom wall from the top surface thereof to the bottom surface and to one said side surface, thereby defining a plurality of receptacle openings along each side wall of the carrier, each receptacle being disposed to be substantially in register with a lead of an inserted I.C. chip and each said receptacle providing visual and physical access to a terminal mounted therein from the top surface of the bottom wall, the bottom surface of the bottom wall and from said receptacle opening in one side surface;
    a plurality of carrier terminals disposed respectively in the receptacles of this said carrier, each carrier terminal including a first female portion dimensioned to receive one said I.C. chip lead and a second female portion adapted to electrically contact a pin terminal, each said carrier terminal being mounted in a carrier receptacle so that said first female portion lies adjacent the receptacle opening in said side surface; and
    a cover comprising the top wall for extending across and covering at least a portion of the chip-receiving recess of said carrier, said cover including latch means for locking engagement with said sub carrier to define the sub-assembly therewith; and
  a header comprising a bottom wall having opposed top and bottom surfaces, a plurality of pins extending through said bottom wall and projecting from both said top and bottom surfaces thereof, said pins being disposed to be substantially in register with the second female portions of said carrier terminals, a plurality of upstanding side walls connecting to and extending from said bottom wall and substantially surrounding said pins to define a carrier socket dimensioned for receviing at least a portion of said carrier such that the second female portions of said carrier terminal engage the pins of said header, Whereby, an I.C. chip may be inserted into said carrier so that each of the leads extending therefrom are received in one said first female portion and whereby each inserted lead may-be reflow soldered to said first female portion by contacting said first female portion with a heater tip introduced through the receptacle opening on the side of the carrier.

26. An I.C. chip carrier assembly as in claim 25, wherein said first female portion of each said carrier terminal includes an outer wall disposed adjacent said receptacle opening and having a window defined therein substantially in registration with said receptacle opening, whereby a heater tip may be inserted through said receptacle opening and said window to make direct contact with an inserted I.C. chip lead for reflow soldering the I.C. chip lead to the carrier terminal.

27. A carrier assembly as in claim 5 wherein the cover of said carrier subassembly further comprises a pair of subassembly latch arms pivotally connected thereto and extending therefrom for locking engagement with said header, whereby said subassembly latch arms of said cover enable secure but removable connection of said subassembly to said header.

28. A carrier assembly as in claim 27 wherein said subassembly latch arms each comprise a locking ledge at locations thereon for locking engagement with said header and wherein each said subassembly latch arm further comprises in actuator at a location thereon spaced from the corresponding locking ledge, said pivotal connections of said subassembly latch arms to said cover being disposed at locations thereon intermediate the corresponding actuator and the locking ledge, whereby forces exerted on said actuators cause said subassembly latch arms to pivotally rotate out of locking engagement with said header.

* * * * *